United States Patent
Liu et al.

(10) Patent No.: US 12,349,304 B2
(45) Date of Patent: Jul. 1, 2025

(54) ELECTRONIC DEVICE AND DEVICE MODULE

(71) Applicant: Wistron Corporation, New Taipei (TW)

(72) Inventors: Chia-Hsin Liu, New Taipei (TW); Yu-Jian Wu, New Taipei (TW); Wei Lin, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 308 days.

(21) Appl. No.: 17/980,601

(22) Filed: Nov. 4, 2022

(65) Prior Publication Data

US 2024/0081015 A1    Mar. 7, 2024

(30) Foreign Application Priority Data

Sep. 1, 2022   (CN) .......................... 202211066258.2

(51) Int. Cl.
*H05K 7/14* (2006.01)
*H05K 5/02* (2006.01)

(52) U.S. Cl.
CPC ......... *H05K 7/1487* (2013.01); *H05K 5/0221* (2013.01)

(58) Field of Classification Search
CPC .. H05K 7/1487; H05K 5/0221; G06F 1/1601; G06F 1/181
See application file for complete search history.

(56) References Cited

U.S. PATENT DOCUMENTS

| | | | |
|---|---|---|---|
| 7,394,660 B2 * | 7/2008 | Hidaka | H05K 7/1489 |
| 9,501,110 B2 * | 11/2016 | Heyd | H05K 7/1487 |
| 9,958,913 B2 * | 5/2018 | Heyd | G06F 1/187 |
| 10,416,731 B2 * | 9/2019 | Heyd | H05K 7/1487 |
| 11,369,032 B2 * | 6/2022 | Li | H05K 7/1487 |
| 11,388,830 B2 * | 7/2022 | Pham | G06F 1/181 |
| 2005/0257232 A1 * | 11/2005 | Hidaka | G11B 33/126 |

(Continued)

FOREIGN PATENT DOCUMENTS

TW    I754908 B    2/2022

OTHER PUBLICATIONS

Examination report dated May 18, 2023, listed in related Taiwan patent application No. 111135999.

*Primary Examiner* — Imani N Hayman
*Assistant Examiner* — Theron S Milliser
(74) *Attorney, Agent, or Firm* — McClure, Qualey & Rodack, LLP

(57) ABSTRACT

An electronic device includes a chassis casing, a device casing, a latch assembly, a bracket, and a rotating shaft assembly. The chassis casing includes a bottom plate. The device casing is detachably disposed in the chassis casing, and the device casing is provided with a stopper. The latch assembly is disposed at the chassis casing, and the latch assembly includes a sliding member. The bracket is disposed in the chassis casing and at an end of the device casing opposite to the latch assembly. The rotating shaft assembly is respectively connected to the device casing and the bracket. The device casing is adjustable between an installation position and an lifting position via the rotating shaft assembly. The sliding member of the latch assembly is used to fix the stopper, so that the device casing is located at the installation position.

15 Claims, 16 Drawing Sheets

(56) References Cited

U.S. PATENT DOCUMENTS

| | | | |
|---|---|---|---|
| 2015/0355686 A1* | 12/2015 | Heyd | G11B 33/128 |
| | | | 361/679.31 |
| 2017/0045922 A1* | 2/2017 | Heyd | G11B 33/128 |
| 2018/0210519 A1* | 7/2018 | Heyd | G06F 1/187 |
| 2020/0004302 A1* | 1/2020 | Heyd | H05K 7/1487 |
| 2020/0375054 A1* | 11/2020 | Pham | H05K 7/1488 |
| 2021/0368645 A1* | 11/2021 | Li | H05K 5/023 |
| 2024/0081015 A1* | 3/2024 | Liu | H05K 7/1487 |

* cited by examiner

ELECTRONIC DEVICE AND DEVICE MODULE

CROSS-REFERENCE TO RELATED APPLICATION

This non-provisional application claims priority under 35 U.S.C. § 119(a) to Patent Application No. 202211066258.2 filed in China on Sep. 1, 2022, the entire contents of which are hereby incorporated by reference.

BACKGROUND

Technical Field

The present disclosure relates to an electronic device, and in particular, to an electronic device having a casing with expansion slots.

Related Art

A server is commonly used in an industrial computer. The structure of the server is often limited due to problems such as expansion ability, heat dissipation efficiency, a space ratio, and management expenses.

In addition, due to the structure of the server, a user often suffers problems such as complicated operations and time-consuming assembling during disassembly and assembly of the server and assembly of an electronic element.

SUMMARY

In view of the above, the present disclosure provides an electronic device. In an embodiment, the electronic device includes a chassis casing, a device casing, a latch assembly, a bracket, and a rotating shaft assembly. The chassis casing includes a bottom plate. The device casing is detachably disposed in the chassis casing and is provided with a stopper. The latch assembly is disposed in the chassis casing and includes a sliding member. The bracket is disposed in the chassis casing and at an end of the device casing opposite to the latch assembly. The rotating shaft assembly is respectively connected to the device casing and the bracket. The device casing is driven by the rotating shaft assembly to reach an installation position or an lifting position relative to the bottom plate, and an angle is formed between the installation position and the lifting position. The sliding member of the latch assembly is used to fix the stopper, so that the device casing is located at the installation position.

According to some embodiments, the latch assembly further includes a pushing member. The pushing member is connected to the sliding member, and the pushing member is configured to drive the sliding member to move away from the stopper of the device casing.

According to some embodiments, the latch assembly further includes a frame body. The frame body includes a top plate and a side plate. The side plate is connected to the top plate and is at an angle to the top plate. The pushing member is disposed on the top plate, and the sliding member is disposed on the side plate.

According to some embodiments, the latch assembly further includes an elastic element connected to the side plate and a sliding member body of the sliding member.

According to some embodiments, the pushing member includes a pushing member body and a first fixing portion. The first fixing portion is disposed on the pushing member body. The sliding member is provided with a second fixing portion. The second fixing portion protrudes from the sliding member body and is connected to the first fixing portion.

According to some embodiments, the first fixing portion is provided with a first opening portion, the second fixing portion is a tongue, and the tongue extends through the first opening portion.

According to some embodiments, the pushing member is rotatably disposed on the top plate, and the second fixing portion of the sliding member is a tongue. The tongue is provided with a second opening portion, and the first fixing portion of the pushing member extends through the second opening portion of the second fixing portion of the sliding member.

According to some embodiments, the latch assembly further includes a locking member. The locking member locks the first fixing portion and the second fixing portion.

According to some embodiments, the sliding member includes a limiting portion. The limiting portion is used to abut against the stopper of the device casing. The limiting portion has a guide surface and an abutment surface, and a guide angle is formed between the guide surface and the abutment surface. The stopper is used to move along the guide surface and abut against the abutment surface, so that the device casing is fixed at the installation position.

According to some embodiments, the device casing has an accommodating portion, and further includes a plurality of partition plates configured to partition the accommodating portion into a plurality of expansion slots.

The present disclosure further provides a device module. In an embodiment, the device module includes a device casing, a latch assembly, a bracket, and a rotating shaft assembly. The device casing is provided with a stopper. The latch assembly is disposed at an end of the device casing and includes a sliding member. The bracket is disposed at an end of the device casing opposite to the latch assembly. The rotating shaft assembly is respectively connected to the device casing and the bracket. The device casing is driven by the rotating shaft assembly to reach a positioning position and an opening position relative to the bracket, and an angle is formed between the installation position and the lifting position.

According to some embodiments, a user may move, by operating the sliding member of the latch assembly, the device casing to reach the installation position or the lifting position. When the sliding member drives the limiting portion away from the stopper, the device casing is pushed to the lifting position through force applied by the rotating shaft assembly. When the device casing is pressed, the sliding member moves, and the stopper is fixed to limit movement of the stopper, so that the device casing is located at the installation position. With the structures such as the latch assembly, the bracket, the device casing, and the like, the user may easily disassemble or assemble the electronic device, and install an electronic assembly in the device casing.

According to some embodiments, the chassis casing of the electronic device includes an expansion casing and a device casing. The expansion casing is disposed at a front end of the device casing, and the expansion casing and the front end of the device casing are on a same horizontal plane. Compared with a chassis having the expansion casing and the device casing that are stacked, the electronic device is relatively short in a longitudinal direction, occupies a relatively small space in the longitudinal direction, and has a same expansion capacity.

According to some embodiments, the device module can be used with any chassis. The user controls the sliding member to move through the structures such as the bracket, the latch assembly, the device casing, and the like, so that the device casing is located at the lifting position or the installation position. In this way, the user can quickly assemble the chassis and easily disassemble and assemble the electronic assembly.

DETAILED DESCRIPTION

Figure 1:
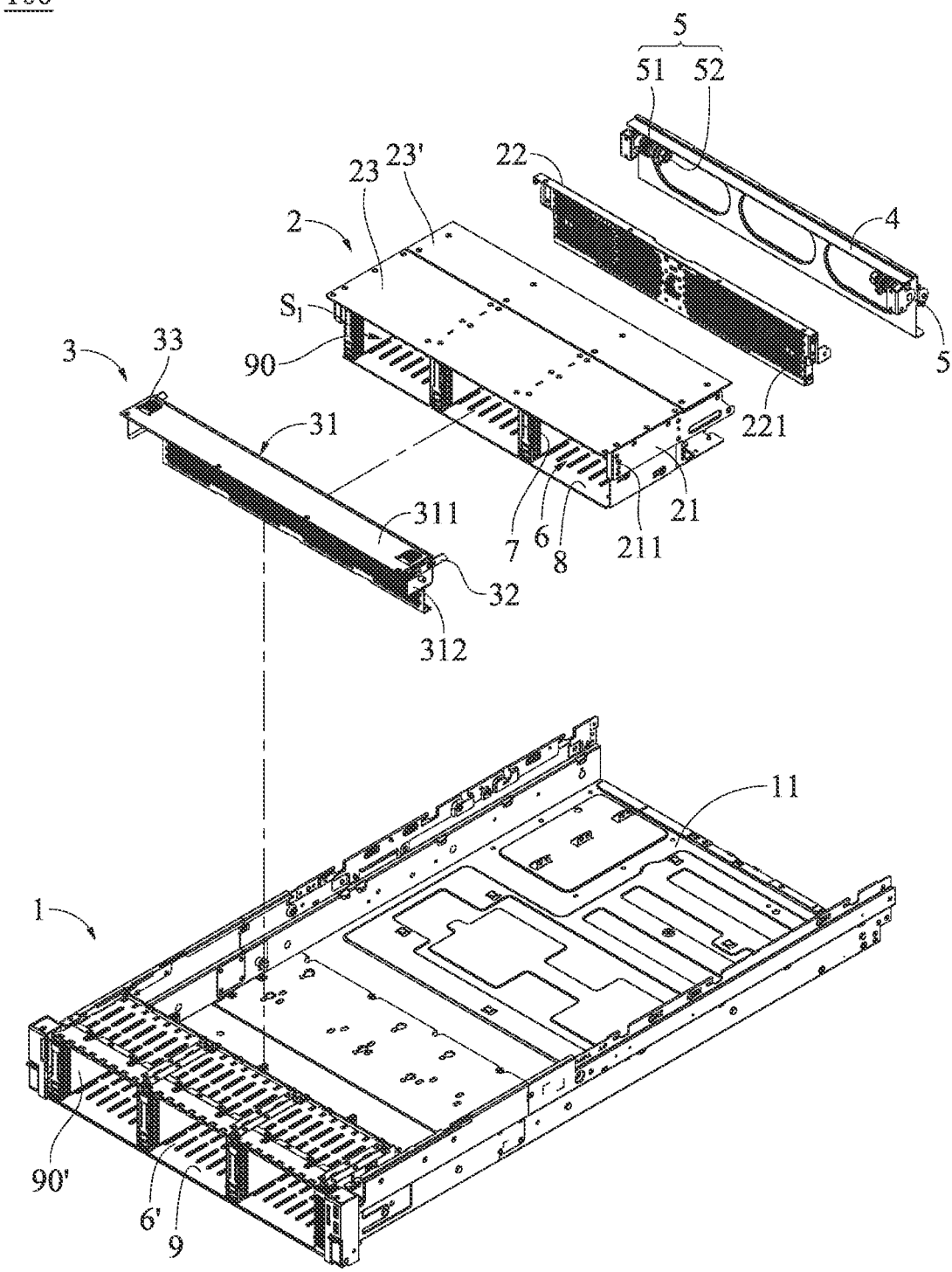
FIG. 1 illustrates a schematic exploded view of an electronic device according to an embodiment.
Figure 2:
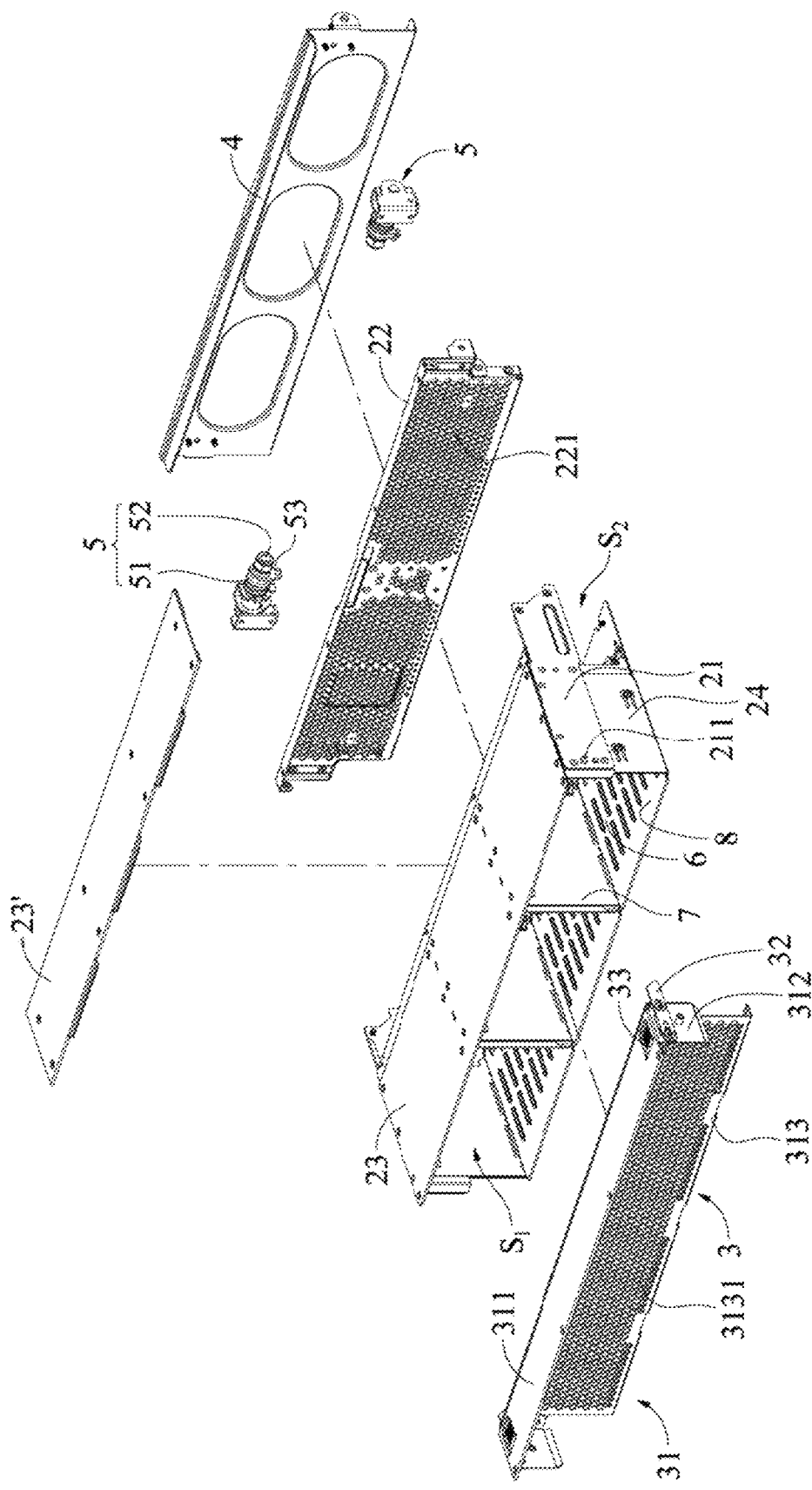
FIG. 2 illustrates a schematic exploded view of a device module according to the embodiment shown in FIG. 1.
Figure 3:
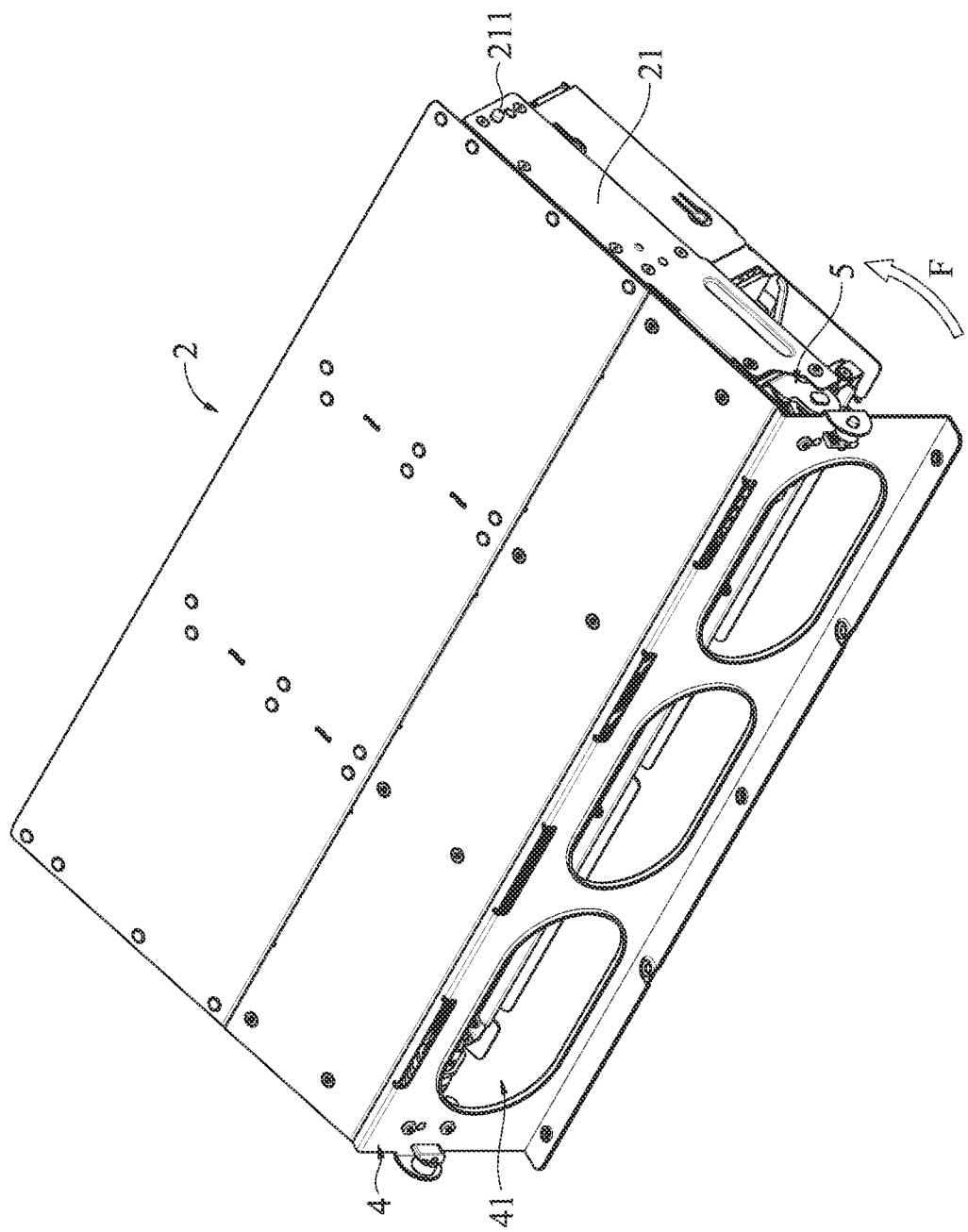
FIG. 3 illustrates a schematic diagram of a combination of a device casing and a first bracket according to the embodiment shown in FIG. 1.
Figure 10:
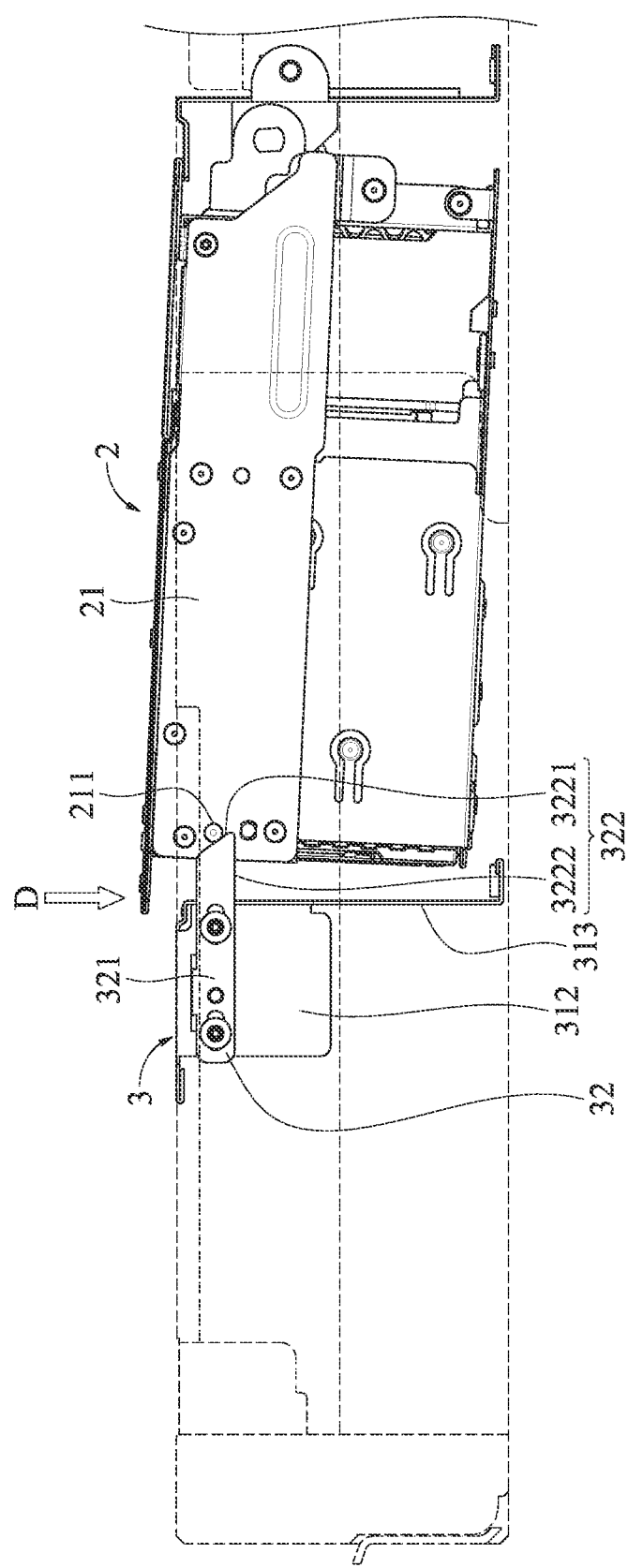
Figure 11:
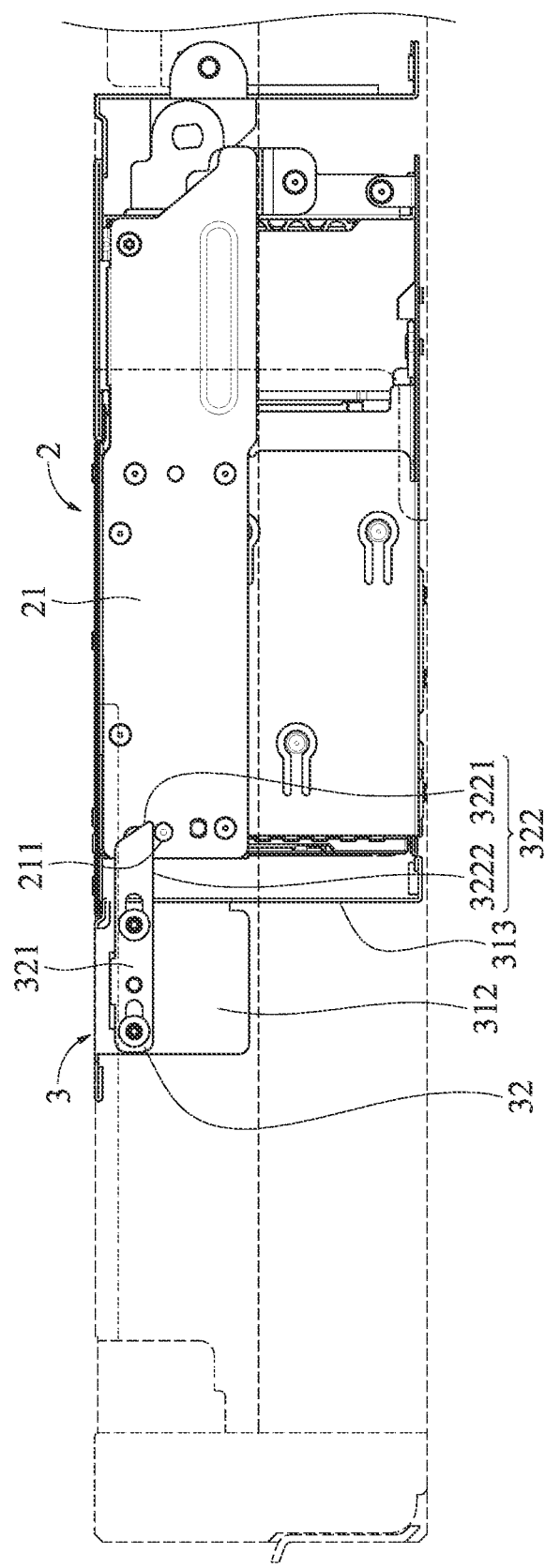

Refer to FIG. 1 to FIG. 3. FIG. 1 illustrates a schematic exploded view of an electronic device 100 according to an embodiment. FIG. 2 illustrates a schematic exploded view of a device module according to the embodiment shown in FIG. 1. FIG. 3 illustrates a schematic diagram of a combination of a device casing 2 and a first bracket 1 according to the embodiment shown in FIG. 1. The electronic device 100 includes a chassis casing 1, a device casing 2, a latch assembly 3, a first bracket 4, and a rotating shaft assembly 5. The chassis casing 1 includes a bottom plate 11. The device casing 2 is detachably disposed in the chassis casing 1. The device casing 2 includes a side plate 21, and the side plate 21 is provided with a stopper 211. The latch assembly 3 is disposed in the chassis casing 1, and the latch assembly 3 includes a frame body 31 and a sliding member 32. The frame body 31 is disposed in the chassis casing 1 and is detachably disposed on one side of the device casing 2. The sliding member 32 is disposed on the frame body 31, and the sliding member 32 includes a sliding member body 321. The sliding member body 321 is provided with a limiting portion 322 (see FIG. 4). The limiting portion 322 is selectively engaged with the stopper 211 of the device casing 2. The first bracket 4 is disposed in the chassis casing 1 and on another side of the device casing 2 opposite to the latch assembly 3 (that is to say, the latch assembly 3 and the first bracket 4 are respectively disposed on two opposite sides of the device casing 2). The first bracket 4 may be provided with a plurality of first heat dissipation holes 41, so as to assist the electronic assembly in the chassis casing 1 to dissipate the heat generated during operation. The rotating shaft assembly 5 is respectively connected to the device casing 2 and the first bracket 4. The device casing 2 is driven by the rotating shaft assembly 5 to reach an installation position or an lifting position relative to the bottom plate 11, and an angle is formed between the installation position and the lifting position. (Refer to FIG. 10 and FIG. 11. FIG. 10 shows that the device casing 2 is at the lifting position, and FIG. 11 shows that the device casing 2 is at the installation position. Details are described later). The rotating shaft assembly 5 may have a force normally push the device casing 2 from the installation position to the lifting position. According to the embodiment shown in FIG. 1, the rotating shaft assembly 5 includes an elastic assembly 51. The sliding member 32 of the latch assembly 3 is fixed with the stopper 211 selectively, so that the device casing 2 is located at the installation position. According to some embodiments, the sliding member 32 can be at a first position P1 (see FIG. 6) or a second position P2 (see FIG. 7). When the sliding member 32 is at the first position P1, the limiting portion 322 abuts with the stopper 211 to maintain the device casing 2 at the installation position (see FIG. 11).

The electronic device 100 is, for example, but not limited to, a server chassis. The device casing 2 is disposed in the chassis casing 1, and the device casing 2 has an accommodating portion $S_1$. The electronic assembly can be placed in the accommodating portion $S_1$. The electronic assembly is for example, but not limited to, a hard disk. According to the embodiment shown in FIG. 1, the device casing 2 further includes a plurality of partition plates 7 configured to partition the accommodating portion $S_1$ into a plurality of expansion slots 6. A size of each expansion slot 6 is correspondingly disposed according to a size of the electronic assembly. As shown in FIG. 1, 3 expansion slots 6 are provided. Each expansion slot 6 can accommodate eight hard disks. In other words, a total of twenty-four hard disks may be disposed in the device casing 2, but the present disclosure is not limited thereto. According to some embodiments, a manufacturer can plan a quantity of expansion slots 6 and a size of the space according to requirements of a customer. In addition, the chassis casing 1 has a front expansion casing 9 located at an end of the device casing 2 opposite to the first bracket 4. A quantity and sizes of expansion slots 6' inside the expansion casing 9 are consistent with those in the device casing 2. The expansion slots 6' can store a plurality of electronic assemblies 90'.

As shown in FIG. 2, the device casing 2 further includes two cover bodies 23 and 23' and a second bracket 22. The second bracket 22 may be provided with a plurality of second heat dissipation holes 221, so as to dissipate the heat generated by the electronic element in the device casing 2 during operation. The stopper 211 is disposed on a side plate 21 of the device casing 2. According to the embodiment of FIG. 2, the device casing 2 includes two side plates 21. Each side plate 21 has a stopper 211. The device casing 2 further includes an inner side plate 24. The inner side plate 24 is adjacent to the side plate 21 and is disposed on a side of the side plate 21 opposite to the device casing 2. A wire arrangement space $S_2$ is formed among the side plate 21, the inner side plate 24, and the bottom plate 8 at a rear end of the device casing 2, which is used for the user to store and arrange wires of the electronic assemblies.

As shown in FIG. 1 to FIG. 3, the rotating shaft assembly 5 includes an elastic assembly 51 and a rotating shaft 52. The elastic assembly 51 may be, but is not limited to, a torsion spring. One rotating shaft assembly 5 may be disposed, which is not limited thereto. According to the embodiment shown in FIG. 3, two rotating shaft assemblies 5 are arranged, which are respectively disposed at two opposite ends of the first bracket 4. The rotating shaft assemblies 5 are respectively connected to the first bracket 4 of the device casing 2 and the second bracket 22 of the device casing 2. In a normal state, the rotating shaft assembly 5 has a force F pushing the device casing 2, so that the device casing 2 is at the lifting position, as shown in FIG. 3. According to some embodiments, the rotating shaft assembly 5 includes a damping assembly 53. The damping assembly 53 is, for example, a nut and a gasket. The damping assembly 53 and the elastic assembly 51 are sleeved on the rotating shaft 52. The damping assembly 53 may reduce the pushing force provided by the rotating shaft assembly 5, and can reduce the speed of movement of the device casing 2 from the installation position to the lifting position.

Figure 4:
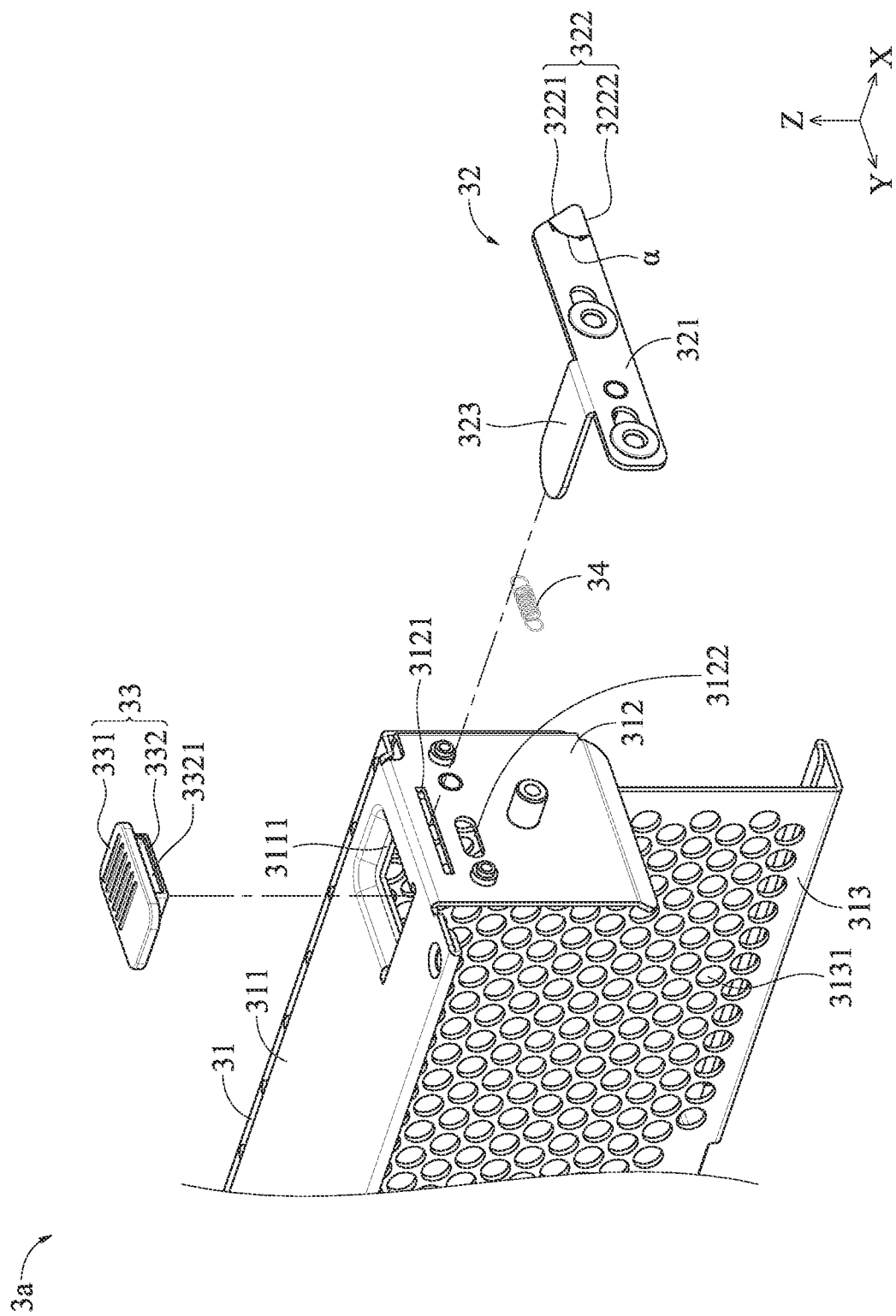
FIG. 4 illustrates a schematic partial view of a latch assembly according to an embodiment.
Figure 5:
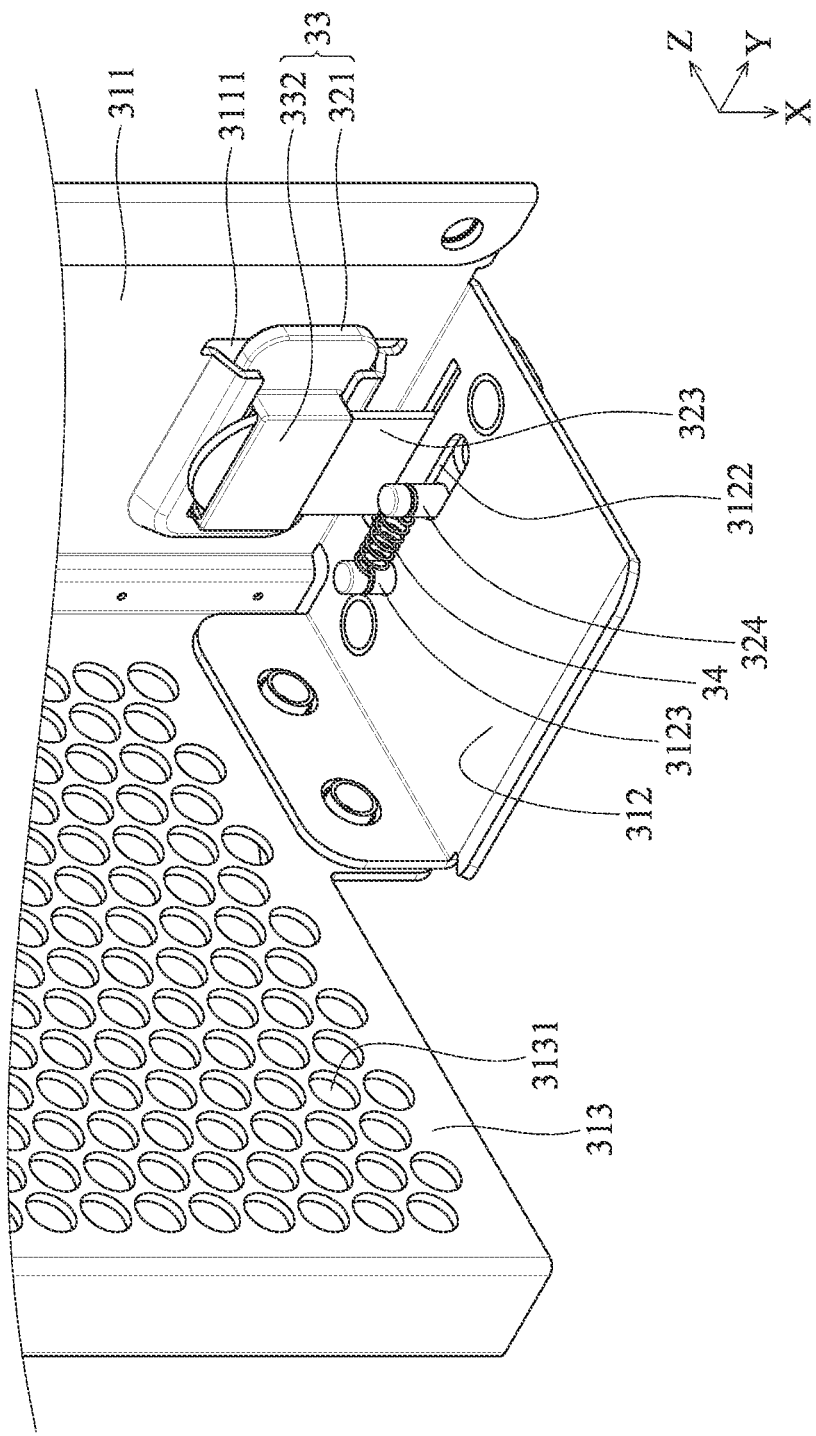
FIG. 5 illustrates a schematic partial view of a latch assembly according to an embodiment.
Figure 7:
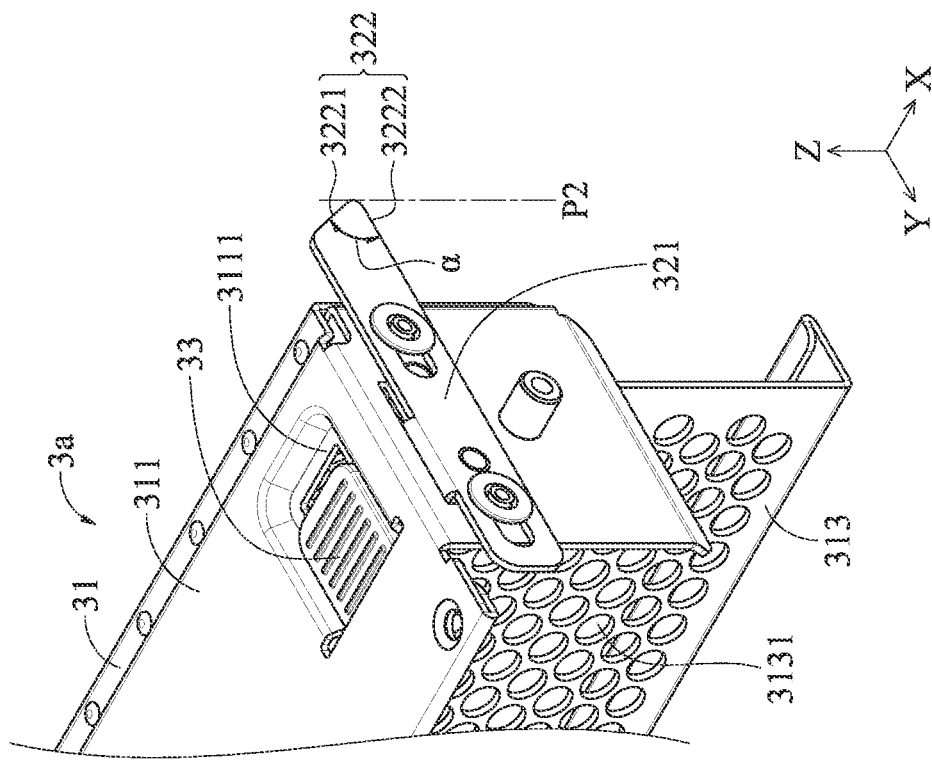
FIG. 6 and FIG. 7 respectively illustrate diagrams of usage states according to the embodiment shown in FIG. 4.
Figure 6:
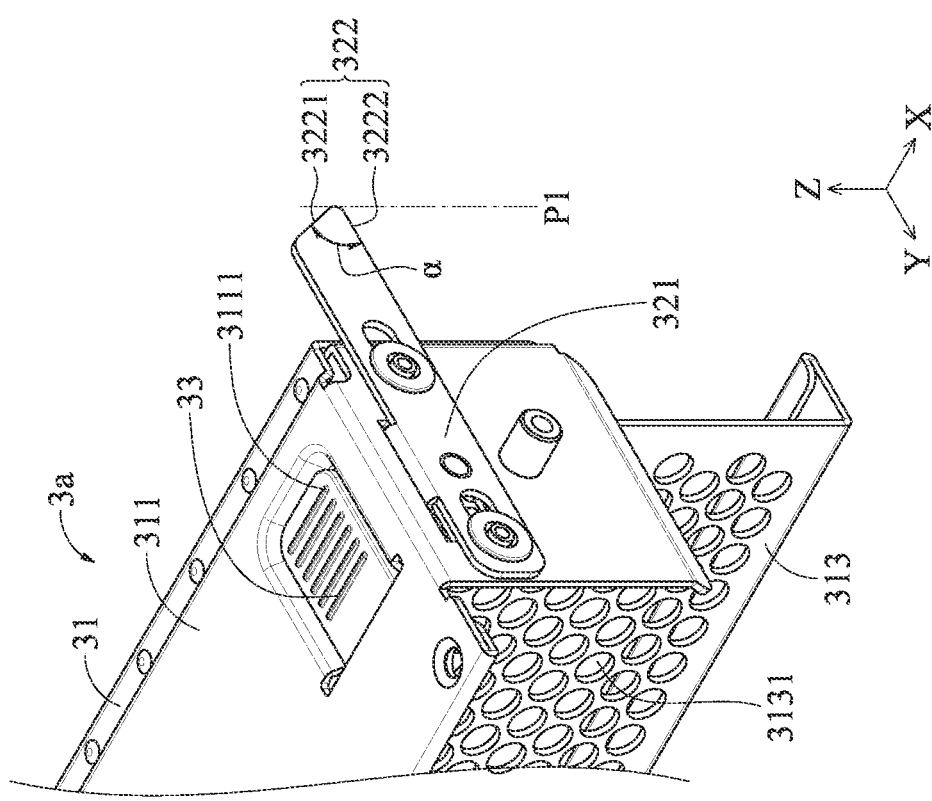

Refer to FIG. 4 to FIG. 7 and FIG. 1 together. FIG. 4 and FIG. 5 respectively illustrate schematic partial views of a latch assembly 3a according to an embodiment. FIG. 6 and FIG. 7 respectively illustrate diagrams of usage states according to the embodiment shown in FIG. 4. The latch assembly 3a is mated with the stopper 211 of the device casing 2 selectively. According to the embodiment shown in FIG. 4, the latch assembly 3a includes a frame body 31, a plate body 313, and a sliding member 32. The frame body 31 includes a top plate 311 and a plate body 313. The plate body 313 is connected to the top plate 311 and is at an angle to the top plate. The plate body 313 is disposed adjacent to the device casing 2, and the plate body 313 is provided with s a plurality of third heat dissipation holes 3131. The third heat dissipation holes 3131 can help dissipate the heat generated by the electronic assembly in the device casing 2 during the operation. The sliding member 32 is disposed on the frame body 31, and the sliding member 32 includes sliding member body 321. An end of the sliding member body 321 has a limiting portion 322, and the sliding member 32 is disposed corresponding to the stopper 211. In other words, when two stoppers 211 are disposed, two latch assemblies 3a are also disposed correspondingly, and two limiting portions 322 are also disposed correspondingly. The present disclosure does not limit the quantity of limiting portions 322 and the quantity of stoppers 211. According to the embodiment shown in FIG. 4, the limiting portion 322 is an end portion of the sliding member body 321, and the limiting portion 322 has a guide surface 3221 and an abutment surface 3222. A guide angle α is formed between the guide surface 3221 and the abutment surface 3222. A magnitude of the guide angle α determines a magnitude of a horizontal component force generated when the stopper 211 and the guide surface 3221 of the limiting portion 322 push against each other (see FIG. 10). The magnitude of the guide angle α of the present disclosure may be, but is not limited to, 30 degrees. According to some embodiments, the guide angle α is 45 degrees. According to some other embodiments, the guide angle α is 90 degrees.

According to the embodiment shown in FIG. 4, the latch assembly 3a further includes a pushing member 33. The pushing member 33 is connected to the sliding member 32, and the pushing member 33 is pushed to drive the sliding member 32 to move to a second position P2. The stopper 211 is disengaged from the limiting portion 322. In other words, the user drives the sliding member 32 to move to the first position P1 or the second position P2 by operating the pushing member 33, so that the limiting portion 322 is fixed to the stopper 211, or the stopper 211 is disengaged from the limiting portion 322. The pushing member 33 may be, but not limited to, a button. According to some embodiments, the pushing member 33 is a knob.

According to the embodiment shown in FIG. 4, the frame body 31 further includes a side plate 312. The side plate 312 is connected to the top plate 311 and is at another angle to the top plate 311. In more detail, the side plate 312 and the plate body 313 are respectively connected to different sides of the top plate 311. The top plate 311 is provided with a pushing groove 3111. The pushing member 33 is disposed in the pushing groove 3111. The pushing member 33 includes a pushing body 331 and a first fixing portion 332. The first fixing portion 332 is disposed on the pushing body 331, and the first fixing portion 332 is provided with a first opening portion 3321. The side plate 312 is provided with a limiting hole 3121. The sliding member 32 further includes a second fixing portion 323. The second fixing portion 323 is extended from the sliding member body 321 toward the pushing member 33, and the second fixing portion 323 extends through the limiting hole 3121 and the first opening portion 3321. In this way, the second limiting portion is fixed with the first fixing portion 332. The space of the pushing groove 3111 is sufficient for the user to operate the pushing member 33 to move the pushing member 33 to drive the sliding member 32 to move between the first position P1 and the second position P2. As shown in FIG. 6 and FIG. 7, the first position P1 and the second position P2 are based on the position of the limiting portion 322 of the sliding member 32, but the present disclosure is not limited thereto. In some embodiments, a distance between two ends of the limiting hole 3121 is greater than or equal to a moving distance of the limiting portion 322 when between the second position P2 and the first position P1.

According to the embodiments shown in FIG. 4 and FIG. 5, the latch assembly 3 further includes an elastic element 34. The side plate 312 further has a movement hole 3122 and a first positioning post 3123. The sliding member 32 further includes a second positioning post 324 extending from the sliding member body 321 toward the side plate 312 and through the movement hole 3122. In some embodiments, two ends of the movement hole 3122 correspond to the first position P1 and the second position P2 of the second positioning post 324, and the first positioning post 3123 is disposed on an inner surface of the side plate 312 (that is, the side plate 312 is opposite to a side of the chassis casing 1). The elastic element 34 is respectively connected to the first positioning post 3123 and the second positioning post 324. The elastic element 34 has an elastic force normally pushing the sliding member 32 to move from the second position P2 to the first position P1. In this way, when the user pushes the pushing member 33 to drive the sliding member 32 to move to the second position P2, after the limiting portion 322 is disengaged from the stopper 211, the elastic element 34 provides the force to push the sliding member 32 to move the sliding member 32 to the first position P1. The elastic element 34 may be, but is not limited to, a spring. According to the embodiments shown in FIG. 4 and FIG. 5, two ends of the spring are respectively hooked to the first positioning post 3123 and the second positioning post 324. The first fixing portion 332 is provided with a first opening portion 3321, and the second fixing portion 323 is a tongue. The tongue extends through the limiting hole 3121 and the first opening portion 3321. A part of the tongue is fixed in the first opening portion 3321. In this way, when the pushing member 33 moves, since the tongue is in the first opening portion 3321, the tongue is driven and further drives the sliding member body 321 to move to the first position P1 or the second position P2. According to some other embodiments, the latch assembly 3 does not include the elastic element 34, and only by pushing the pushing member 33 by the user, the sliding member 32 is driven to move between the first position P1 and the second position P2. In other words, the latch assembly 3 does not have the force to automatically push the sliding member 32 toward the first position P1.

Figure 8:
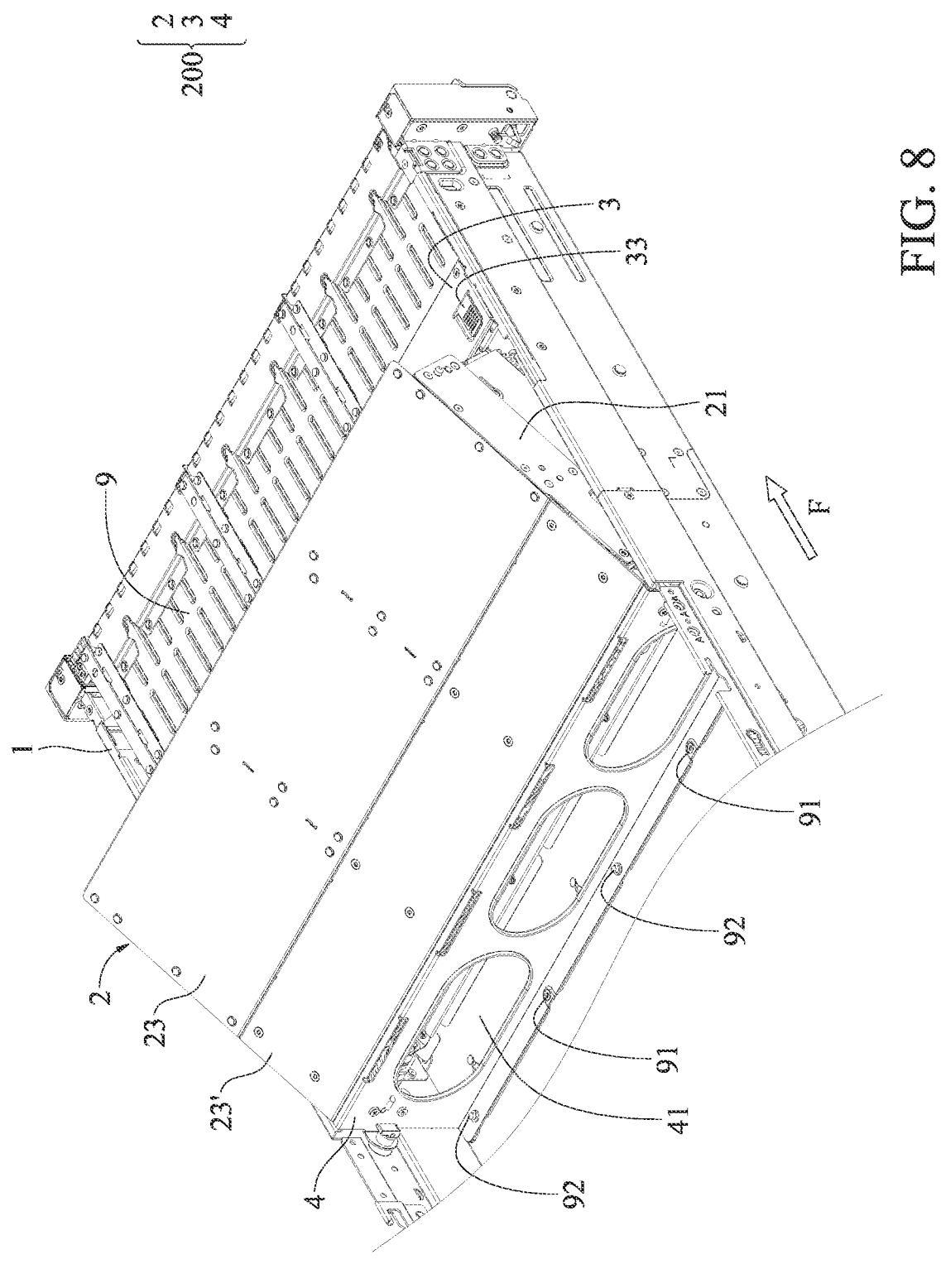
FIG. 8 illustrates a schematic diagram of an appearance of an electronic device according to an embodiment.
Figure 9:
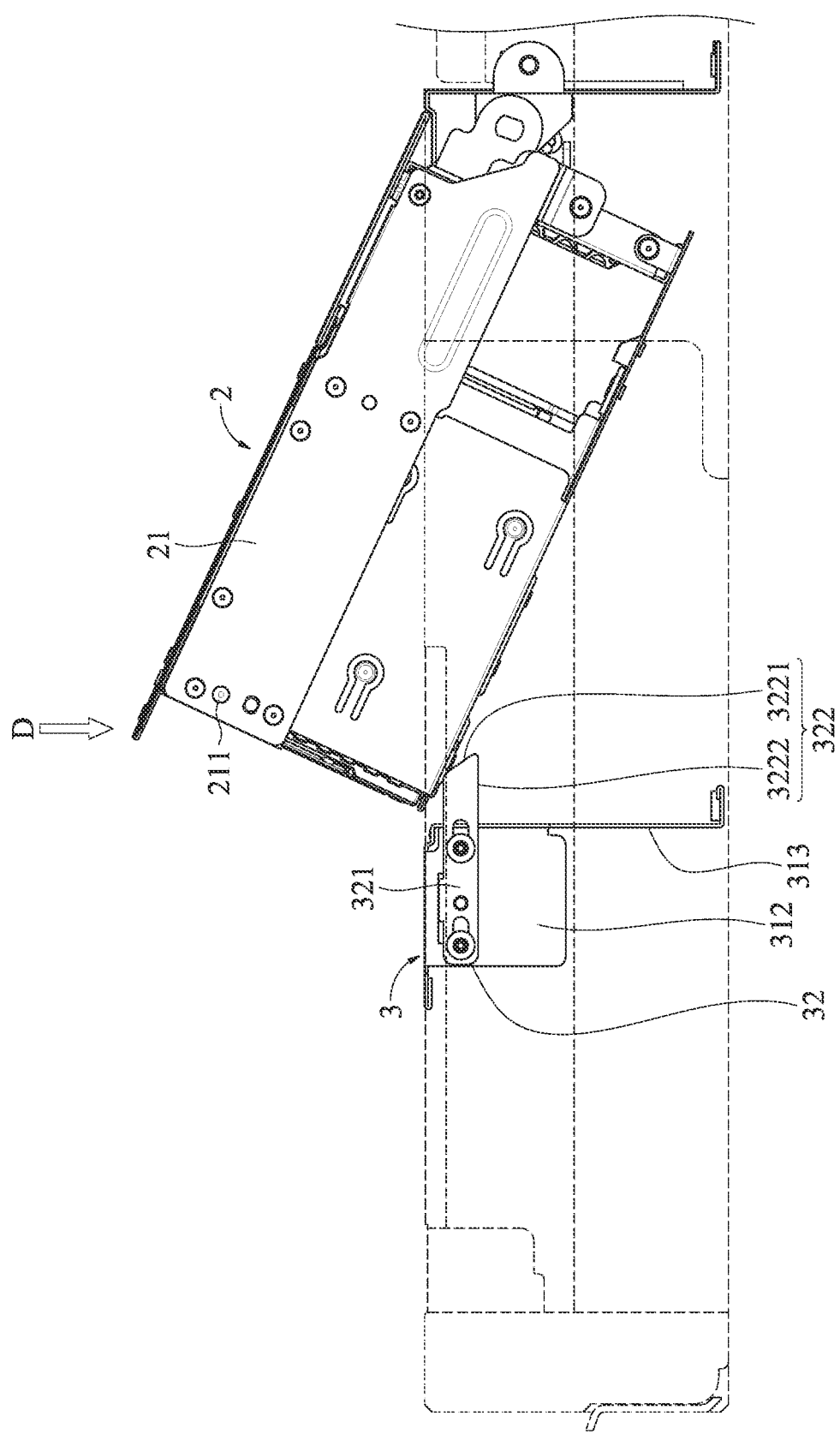
FIG. 9 to FIG. 11 respectively illustrate diagrams of usage states according to the embodiment shown in FIG. 8.

Refer to FIG. 8 to FIG. 11. FIG. 8 illustrates a schematic diagram of an appearance of an electronic device 100 according to an embodiment. FIG. 9 to FIG. 11 illustrate diagrams of usage states according to the embodiment shown in FIG. 8, respectively. In the embodiment, a latch assembly 3 includes an elastic element 34. A first bracket 4 is connected to a device casing 2 through a rotating shaft assembly 5. The first bracket 4 is removably disposed in a chassis casing 1 and is positioned on a bottom plate 11 selectively. According to the embodiment shown in FIG. 8, relative to the first bracket 4, the bottom plate 11 has a locking portion 91 (such as an insertion post) and an alignment portion 92 (such as a screw or a screw hole), so that the first bracket 4 can be aligned and locked to the bottom plate 11. The device casing 2 has an lifting position (see FIG. 9) and an installation position (see FIG. 11) relative to the bottom plate 11. The lifting position means that the device casing 2 rotates relative to the chassis casing 1, and an angle is formed between the bottom plate 8 of the device casing 2 and the bottom plate 11. According to some embodiments, the angle may range from 30 degrees to 45 degrees. As shown in FIG. 8 and FIG. 9, the device casing 2 is initially located at the lifting position. When the device casing 2 is pressed along a pressing direction D, the device casing 2 moves from the lifting position to the installation position, a stopper 211 pushes against a guide surface 3221 of a limiting portion 322, a horizontal component force between the stopper 211 and the limiting portion 322 is greater than the elastic force provided by the elastic element 34, so that a sliding member 32 moves toward a second position P2. After the stopper 211 further moves to an abutment surface 3222 of the limiting portion 322, the force provided by the elastic element 34 pushes the sliding member 32 to return to a first position P1. At the first position P1, the limiting portion 322 restricts movement of the stopper 211 in a direction opposite to the pressing direction D, thereby positioning the device casing 2 at the installation position. When the user pushes a pushing member 33 to the second position P2, the limiting portion 322 is disengaged from the stopper 211, that is, a fixing relationship between the limiting portion 322 and the stopper 211 is released. According to the force F provided by the rotating shaft assembly 5, the device casing 2 moves from the installation position to the lifting position. In some usage states, the device casing 2 is at the lifting position, and the user can assemble or disassemble the electronic assembly 90 (see FIG. 1) in the device casing 2. After the user completes assembling or disassembling the electronic assembly 90, the user presses the device casing 2 along the pressing direction D, and the sliding member 32 moves to the first position P1, so that the limiting portion 322 is fixed to the stopper 211 to fix the device casing 2 at the installation position.

According to the embodiment shown in FIG. 8, the stopper 211 is a cylinder, but the present disclosure is not limited thereto. According to some embodiments, the stopper 211 is a geometric block. In some embodiments, the stopper 211 is snapped into the limiting portion 322 to fix the device casing 2 at the installation position (not shown).

Figure 12:
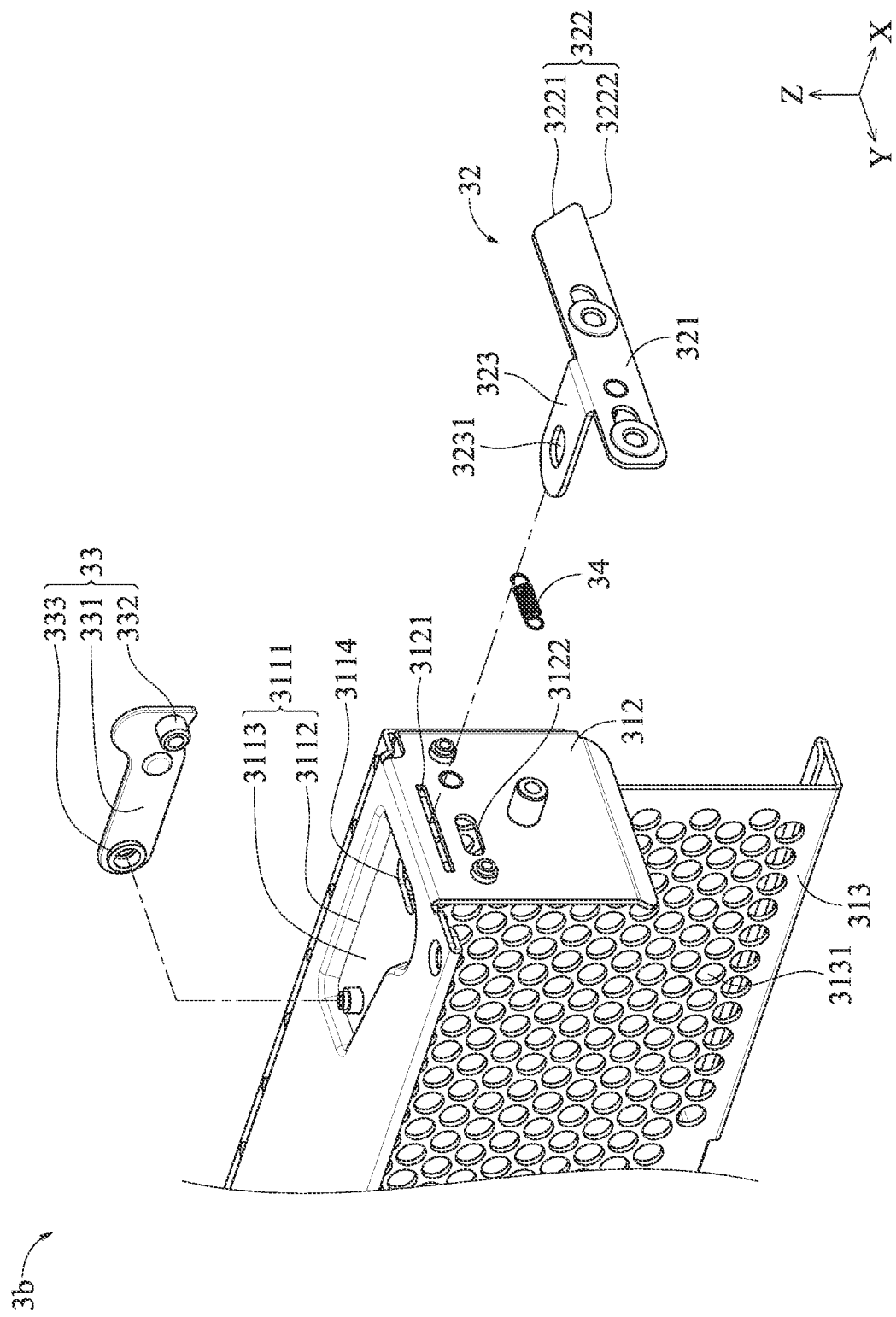
FIG. 12 illustrates a schematic partial view of a latch assembly according to an embodiment.
Figure 13:
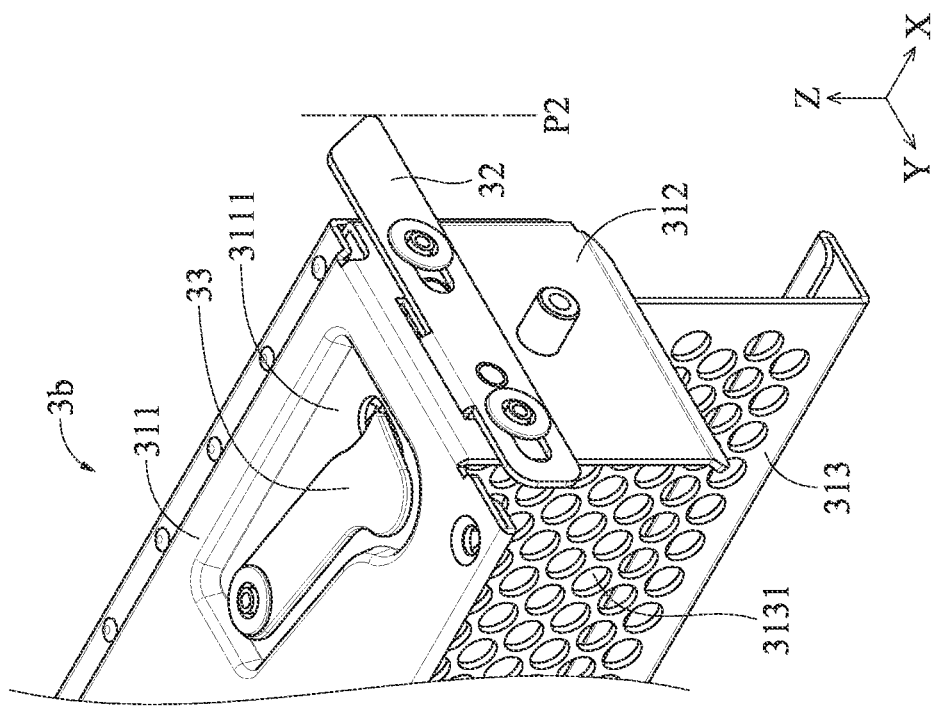
FIG. 13 and FIG. 14 respectively illustrate diagrams of usage states according to the embodiment shown in FIG. 12.
Figure 14:
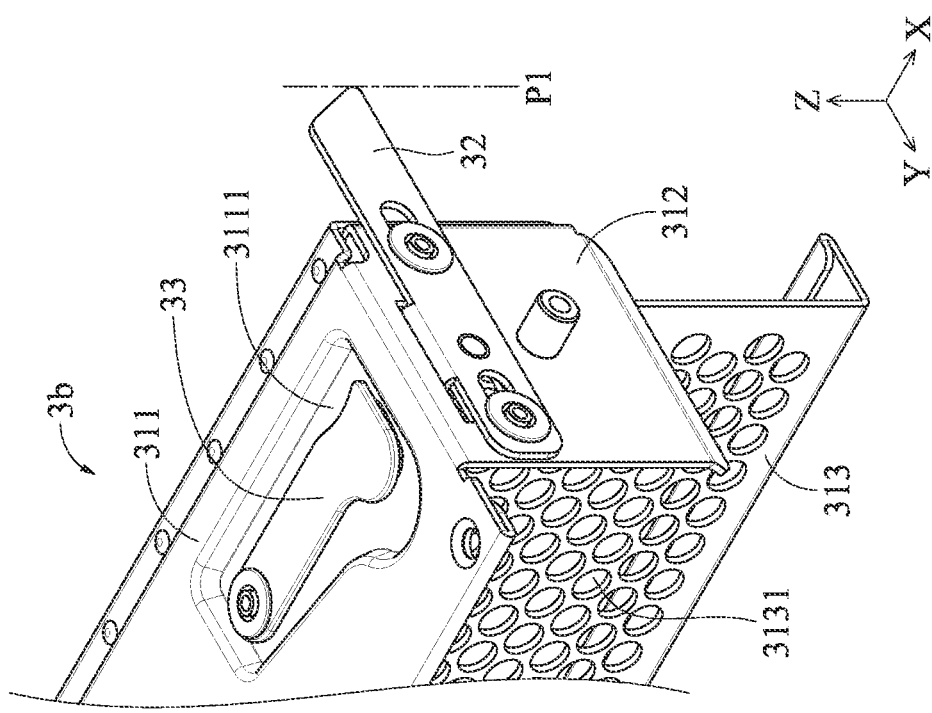
Figure 16:
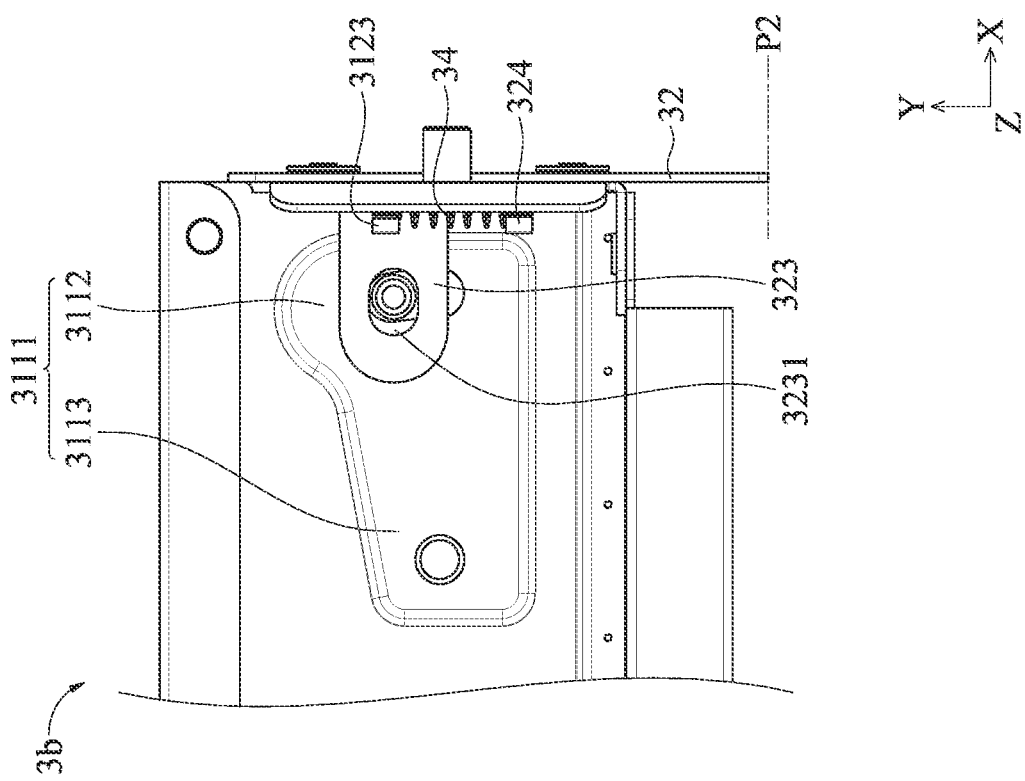
FIG. 15 and FIG. 16 illustrate schematic diagrams respectively corresponding to FIG. 13 and FIG. 14 in different viewing angles.
Figure 15:
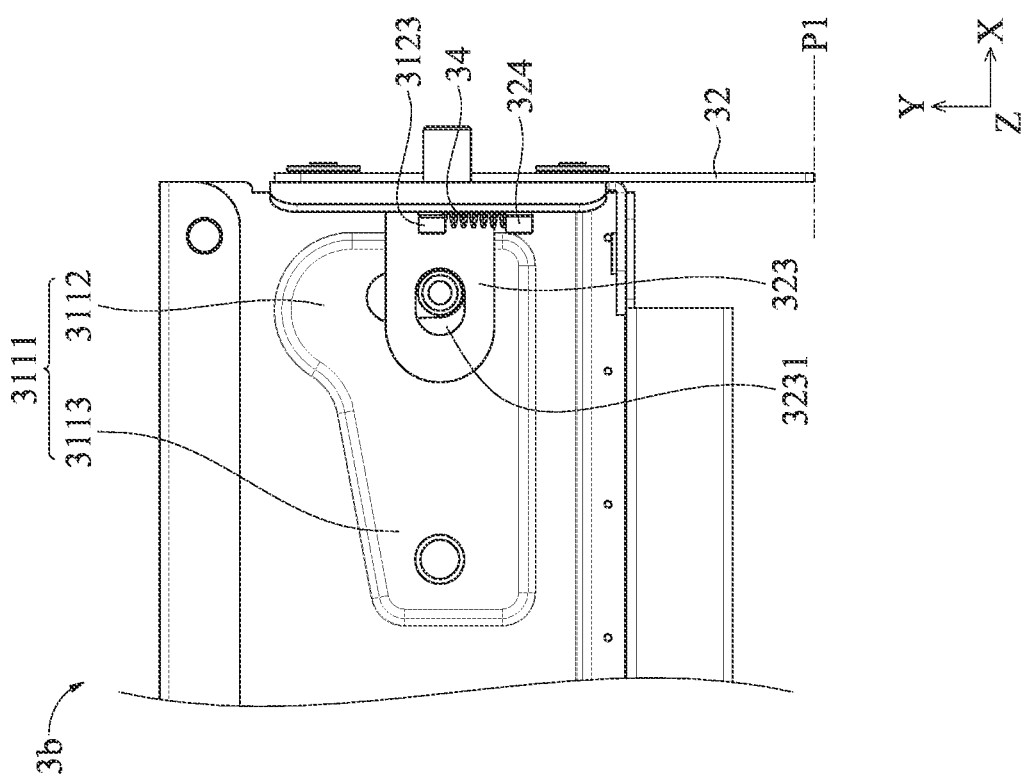

Refer to FIG. 12 to FIG. 16. FIG. 12 illustrates a schematic partial view of a latch assembly 3b according to an embodiment. FIG. 13 and FIG. 14 illustrate diagrams of usage states according to the embodiment shown in FIG. 12. FIG. 15 and FIG. 16 illustrate schematic diagrams respectively corresponding to FIG. 13 and FIG. 14 in different viewing angles. The pushing member 33 is rotatably disposed in the pushing groove 3111. The pushing groove 3111 includes a pushing portion 3112 and a rotating portion 3113. A volume of the pushing portion 3112 is greater than a volume of the rotating portion 3113. The pushing portion 3112 is provided with a hole 3114, and the first fixing portion 332 movably extends through the hole 3114. The pushing member 33 further includes a pivotal connection portion 333 pivotally connected to the rotating portion 3113. According to the embodiment shown in FIG. 12, the first fixing portion 332 is a slidable post, and the second fixing portion 323 is a tongue. The tongue is provided with a second opening portion 3231, and the first fixing portion 332 extends through the hole 3114 and connects with the second opening portion 3231. The pushing member 33 is like a knob. Through the structure, the user rotates the pushing member 33 to move the first fixing portion 332 and further drive the sliding member body 321, so that the limiting portion 322 fixes the stopper 211 or the stopper 211 is disengaged from the limiting portion 322.

Figure 17:
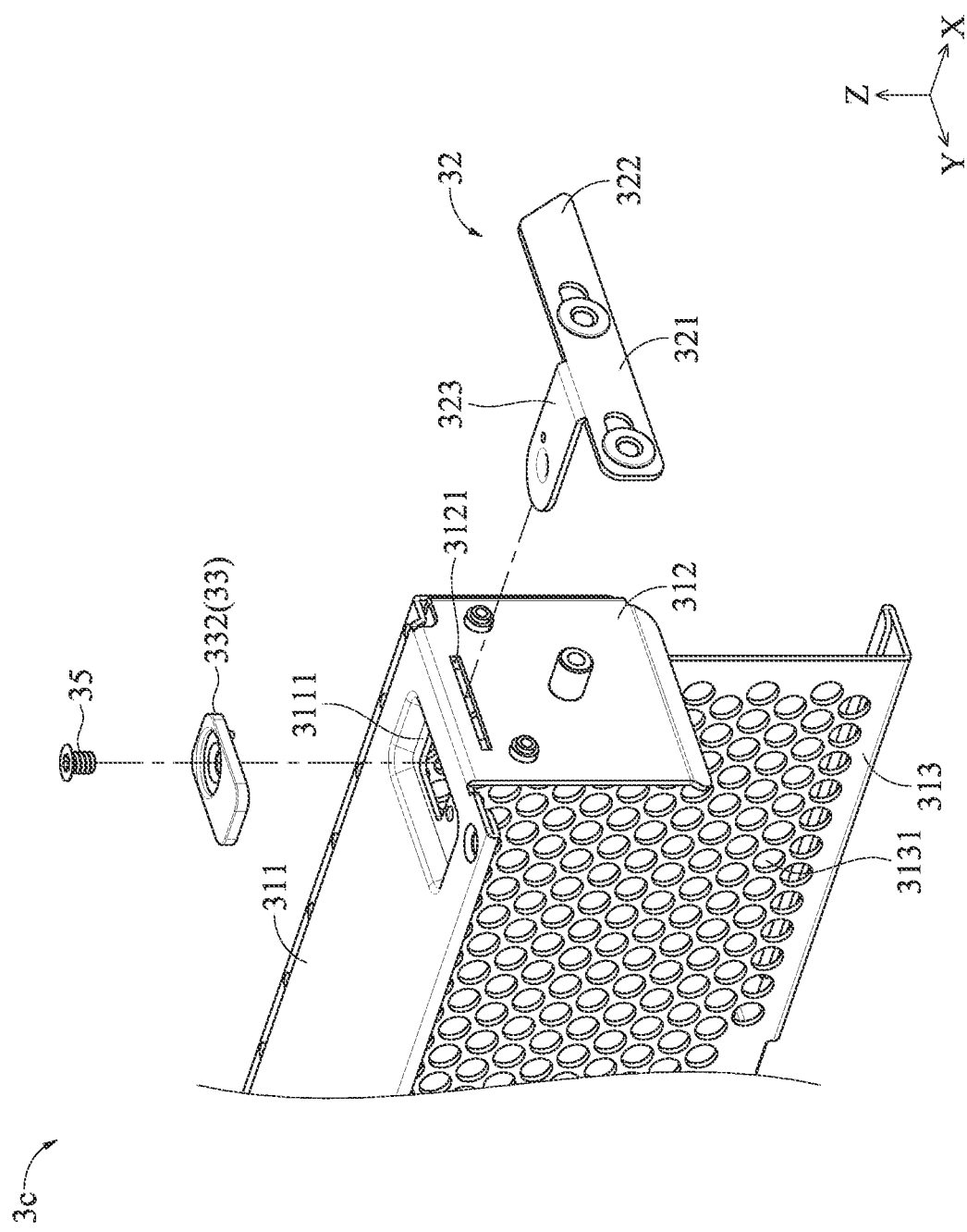
FIG. 17 illustrates a schematic partial view of a latch assembly according to an embodiment.
Figure 19:
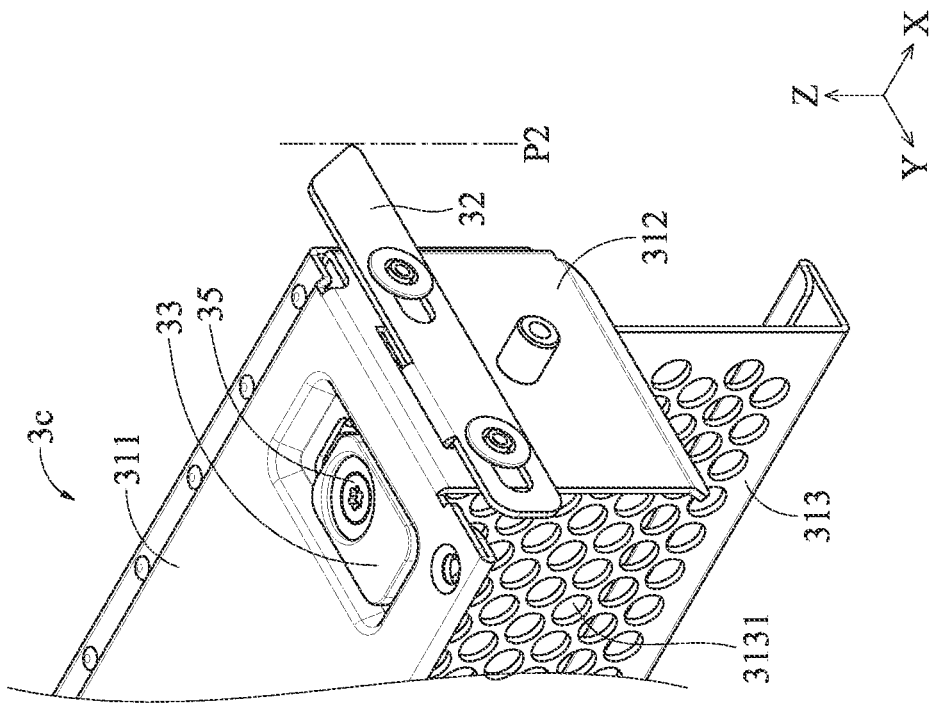
FIG. 18 and FIG. 19 respectively illustrate diagrams of usage states according to the embodiment shown in FIG. 17.
Figure 18:
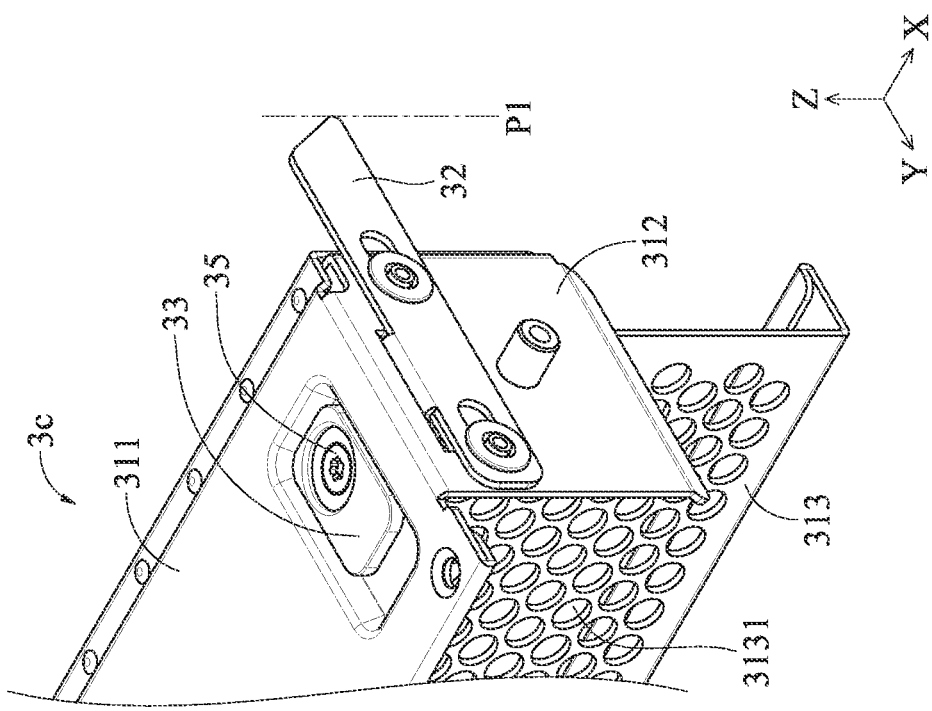
Figure 21:
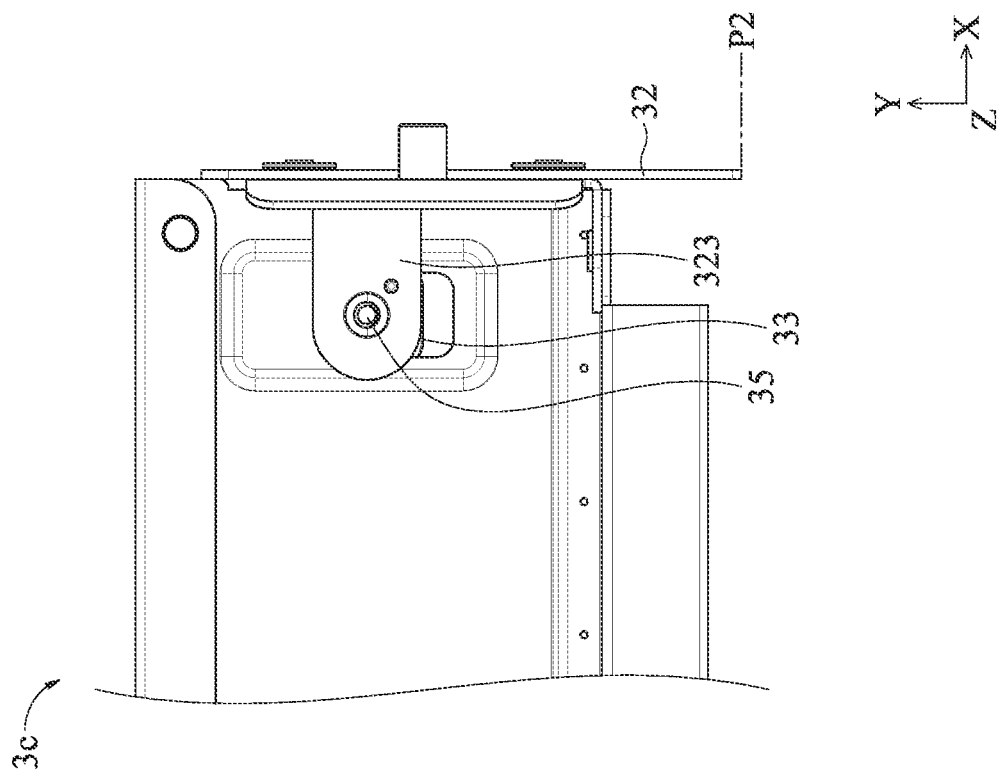
FIG. 20 and FIG. 21 illustrate schematic diagrams respectively corresponding to FIG. 18 and FIG. 19 in different viewing angles.
Figure 20:
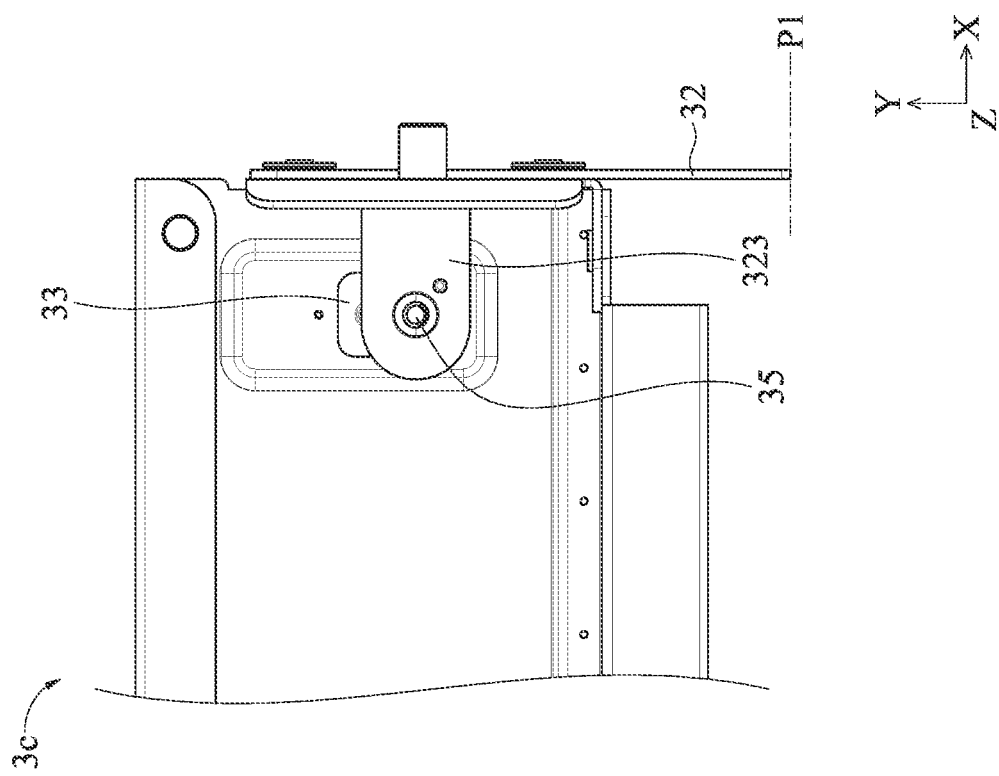

Refer to FIG. 17 to FIG. 21. FIG. 17 illustrates a schematic partial view of a latch assembly 3c according to an embodiment. FIG. 18 and FIG. 19 illustrate diagrams of usage states according to the embodiment shown in FIG. 17. FIG. 20 and FIG. 21 illustrate schematic diagrams respectively corresponding to FIG. 18 and FIG. 19 in different viewing angles. According to the embodiment, the latch assembly 3c further includes a locking member 35. The locking member 35 locks the first fixing portion 332 and the second fixing portion 323. The first fixing portion 332 has a screw hole, the second fixing portion 323 is a tongue, and a tongue body is provided with a screw hole. The locking member 35 is like a screw. The screw locks the first fixing portion 332 and the second fixing portion 323 through the screw hole. In this way, the user pushes the pushing member 33 to drive the second fixing portion 323, thereby driving the sliding member body 321 to move, so that the sliding member 32 moves to the first position P1 or the second position P2.

Referring to FIG. 2 and FIG. 9 again, in the embodiment shown in FIG. 2, a device module 200 includes a device casing 2 (see FIG. 1), a latch assembly 3, a first bracket 4, and a rotating shaft assembly 5. The rotating shaft assembly 5 has an opening position (see FIG. 9) and a positioning position (see FIG. 11) relative to the first bracket 4. The positioning position and the opening position are equivalent to the installation position and the lifting position. The rotating shaft assembly 5 has a force to normally push the device casing 2 from the positioning position to the opening position. The sliding member 32 has a first position P1 and a second position P2. When the sliding member 32 is at the first position P1, the limiting portion 322 fixes the stopper 211 to maintain the device casing 2 at the positioning position.

The device module 200 may be used with a server chassis, and may also be installed in other chassis, which is not limited in the present disclosure. The user operates the sliding member 32 of the latch assembly 3 to cause the device casing 2 to be at the installation position or the lifting position by fixing the stopper 211 to the limiting portion 322 or disengaging the stopper from the limiting portion (by releasing the fixing relationship), so that the user can conveniently assemble or disassemble the device casing 2, and can install the electronic assembly 90 in the expansion slot 6.

According to some embodiments, when the user moves the sliding member to the second position, the limiting portion is separated from the stopper, and the device casing is at the lifting position due to the force of the rotating shaft assembly. When the user presses the device casing, the sliding member moves to the first position, the limiting portion fixes the stopper to restrict movement of the stopper (the device casing), and the device casing is at the installation position. With the structures such as the first bracket, the latch assembly, the device casing, and the like, the user can easily assemble and disassemble the electronic device. According to some embodiments, the chassis casing includes an expansion casing and a device casing. The expansion casing and the device casing are located on a same horizontal plane. In this way, compared with the chassis casing having the expansion casing and the device casing that are stacked, a height in the longitudinal direction is relatively small, a space ratio is reduced, but the expansion capacity is maintained.

According to some embodiments, the device module can be used with any chassis. The user controls the sliding member to move through the structures such as the first bracket, the latch assembly, the device casing, and the like, so that the device casing is located at the lifting position or the installation position. In this way, the user can quickly assemble the chassis and easily disassemble and assemble the electronic assembly. The user may be a manufacturer of the electronic device or the device module, or may be a user that purchases such products, which is not limited in the present disclosure.

What is claimed is:

1. An electronic device, comprising:
a chassis casing, comprising a bottom plate;
a device casing, detachably disposed in the chassis casing and provided with a stopper;
a latch assembly, disposed on the chassis casing, comprising a sliding member, a frame body and a pushing member, wherein the sliding member is at an end of the device casing, the pushing member is connected to the sliding member, and the sliding member is moved away from the stopper of the device casing selectively via the pushing member, the frame body comprises a top plate and a side plate, the side plate is connected to the top plate and a second angle is formed between the top plate and the side plate, the side plate is provided with a limiting hole, the pushing member is disposed on the top plate, and the sliding member is disposed at the side plate, and comprises a pushing member body and a first fixing portion, the first fixing portion is disposed at the pushing member body, the sliding member comprises a sliding member body and is provided with a second fixing portion, and the second fixing portion protrudes from the sliding member body, extends through the limiting hole and is connected to the first fixing portion is connected to the first fixing portion;
a bracket, disposed in the chassis casing and at an another end of the device casing opposite to the latch assembly; and
a rotating shaft assembly, respectively connected to the device casing and the bracket, wherein the rotating shaft assembly comprises an elastic assembly, a rotating shaft, and a damping assembly, the elastic assembly and the damping assembly are sleeved on the rotating shaft
wherein the device casing is adjustable between an installation position and a lifting position relative to the bottom plate via the rotating shaft assembly, and a first angle is formed between the installation position and the lifting position, the rotating shaft assembly have a pushing force normally the device casing from the installation position to the lifting position, and the damping assembly reduces the pushing force provided by the rotating shaft assembly and can reduce the speed of movement of the device casing from the installation position to the lifting position; and
when the device casing is located at the installation position, the sliding member of the latch assembly is fixed with the stopper.

2. The electronic device according to claim 1, wherein the latch assembly further comprises an elastic element, the sliding member comprises a sliding member body, and the elastic element is connected to the side plate and the sliding member body.

3. The electronic device according to claim 1, wherein the first fixing portion is provided with a first opening portion, the second fixing portion is a tongue, and the tongue extends through the first opening portion.

4. The electronic device according to claim 1, wherein the pushing member is rotatably disposed on the top plate, the second fixing portion of the sliding member is a tongue, the tongue is provided with a second opening portion, and the first fixing portion of the pushing member extends through the second opening portion of the second fixing portion of the sliding member.

5. The electronic device according to claim 1, wherein the latch assembly further comprises a locking member, and the first fixing portion and the second fixing portion are locked via the locking member.

6. The electronic device according to claim 1, wherein the sliding member comprises a limiting portion, the limiting portion abuts against the stopper of the device casing selectively, the limiting portion has a guide surface and an abutment surface, a guide angle is formed between the guide surface and the abutment surface, when the device casing is fixed at the installation position, the stopper abuts against the abutment surface.

7. The electronic device according to claim 1, wherein the device casing has an accommodating portion, and the device casing further comprises a plurality of partition plates, the accommodating portion is separated into a plurality of expansion slots via the partition plates.

8. The electronic device according to claim 1, wherein the latch assembly further comprises a pushing member, the pushing member is connected to the sliding member, and the sliding member is moved away from the stopper of the device casing selectively via the pushing member;
the sliding member comprises a sliding member body, the latch assembly further comprises an elastic element, and the elastic element is connected to the side plate and the sliding member body;
the sliding member comprises a limiting portion, the limiting portion abuts against the stopper of the device casing selectively, the limiting portion has a guide surface and an abutment surface, a guide angle is formed between the guide surface and the abutment surface, when the device casing is fixed at the installation position, the stopper abuts against the abutment surface; and the device casing has an accommodating portion, and the device casing further comprises a plurality of partition plates the accommodating portion is separated into a plurality of expansion slots via the partition plates.

9. A device module, comprising:
a device casing, provided with a stopper;
a latch assembly, disposed at an end of the device casing, comprising a sliding member a frame body and a pushing member, wherein the sliding member is at an end of the device casing, the pushing member is connected to the sliding member, and the sliding member is moved away from the stopper of the device casing selectively via the pushing member, the frame body comprises a top plate and a side plate, the side plate is connected to the top plate and a second angle is formed between the top plate and the side plate, the side plate is provided with a limiting hole, the pushing member is disposed on the top plate, and the sliding member is disposed at the side plate, and comprises a pushing member body and a first fixing portion, the first fixing portion is disposed at the pushing member body, the sliding member comprises a sliding member body and is provided with a second fixing portion, and the second fixing portion protrudes from the sliding member body, extends through the limiting hole and is connected to the first fixing portion is connected to the first fixing portion;
a bracket, disposed at an another end of the device casing opposite to the latch assembly; and
a rotating shaft assembly, respectively connected to the device casing and the bracket, wherein the rotating shaft assembly comprises an elastic assembly, a rotating shaft, and a damping assembly, the elastic assembly and the damping assembly are sleeved on the rotating shaft,
wherein the device casing is adjustable between positioning position and an opening position relative to the bracket via the rotating shaft assembly, and a first angle is formed between the positioning position and the opening position, the rotating shaft assembly have a pushing force normally the device casing from the installation position to the lifting position, and the damping assembly reduces the pushing force provided by the rotating shaft assembly and can reduce the speed of movement of the device casing from the positioning position to the opening position; and
when the device casing is located at the positioning position, the sliding member of the latch assembly fixes with the stopper.

10. The device module according to claim 9, wherein the latch assembly further comprises an elastic element, the sliding member comprises a sliding member body, and the elastic element is connected to the side plate and the sliding member body.

11. The device module according to claim 9, wherein the first fixing portion is provided with a first opening portion, the second fixing portion is a tongue, and the tongue extends through the first opening portion.

12. The device module according to claim 9, wherein the pushing member is rotatably disposed on the top plate, the second fixing portion of the sliding member is a tongue, the tongue is provided with a second opening portion, and the first fixing portion of the pushing member extends through the second opening portion of the second fixing portion of the sliding member.

13. The device module according to claim 9, wherein the latch assembly further comprises a locking member, and the first fixing portion and the second fixing portion are locked via the locking member.

14. The device module according to claim 9, wherein the sliding member comprises a limiting portion, the limiting portion is used to abut against the stopper of the device casing, the limiting portion has a guide surface and an abutment surface, a guide angle is formed between the guide surface and the abutment surface, when the device casing is fixed at the positioning position, the stopper abuts against the abutment surface selectively.

15. The device module according to claim 9, wherein;
the latch assembly further comprises an elastic element, the sliding member comprises a sliding member body, and the elastic element is connected to the side plate and the sliding member body;
the sliding member comprises a limiting portion, the limiting portion abuts against the stopper of the device casing selectively, the limiting portion has a guide surface and an abutment surface, a guide angle is formed between the guide surface and the abutment surface;
when the device casing is fixed at the positioning position, the stopper abuts against the abutment surface; and
the device casing has an accommodating portion, and the device casing further comprises a plurality of partition plates which separate the accommodating portion into a plurality of expansion slots.

* * * * *